(12) United States Patent
Zeng et al.

(10) Patent No.: US 10,608,549 B2
(45) Date of Patent: Mar. 31, 2020

(54) CONVERTER MODULE

(71) Applicant: Delta Electronics (Shanghai) CO., LTD, Shanghai (CN)

(72) Inventors: Jianhong Zeng, Shanghai (CN); Xiaoni Xin, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 0 days.

(21) Appl. No.: 16/289,758

(22) Filed: Mar. 1, 2019

(65) Prior Publication Data

US 2019/0199232 A1    Jun. 27, 2019

Related U.S. Application Data

(63) Continuation of application No. 15/344,765, filed on Nov. 7, 2016, now Pat. No. 10,263,530.

(30) Foreign Application Priority Data

Nov. 13, 2015   (CN) .......................... 2015 1 0780735

(51) Int. Cl.
*H01F 27/28* (2006.01)
*H02M 7/00* (2006.01)
(Continued)

(52) U.S. Cl.
CPC ............ *H02M 7/003* (2013.01); *H01F 27/24* (2013.01); *H01F 27/28* (2013.01); *H01F 27/40* (2013.01); *H02M 3/33576* (2013.01); *H02M 7/04* (2013.01); *H05K 1/0203* (2013.01); *H05K 1/0254* (2013.01); *H05K 1/111* (2013.01); *H05K 1/115* (2013.01); *H05K 1/142* (2013.01); *H05K 1/145* (2013.01); *H05K 1/165* (2013.01); *H05K 1/181* (2013.01); *H05K 1/182* (2013.01);
(Continued)

(58) Field of Classification Search
CPC ............................ H01F 5/00; H01F 27/00–36
USPC ..................... 336/65, 83, 192, 200, 232–234
See application file for complete search history.

(56) References Cited

U.S. PATENT DOCUMENTS

| 8,536,968 B1 * | 9/2013 | Chang .................. H01F 17/043 336/192 |
| 2008/0079524 A1 | 4/2008 | Suzuki |
| 2012/0212314 A1 | 8/2012 | Li et al. |

FOREIGN PATENT DOCUMENTS

| CN | 204066973 U | | 12/2014 |
| JP | 01089386 A | * | 4/1989 |

OTHER PUBLICATIONS

The IN1OA dated Mar. 27, 2019 by the IN Office.

* cited by examiner

*Primary Examiner* — Tuyen T Nguyen
(74) *Attorney, Agent, or Firm* — Yunling Ren

(57) ABSTRACT

A converter module includes: a system board; and an isolated rectifier unit connected with the system board via at least one pin, the isolated rectifier unit including: a system board; a circuit module; and an isolated rectifier unit arranged adjacent to the circuit module and connected with the system board; wherein the isolated rectifier unit includes: a magnetic core comprising at least one core column parallel to the system board and two cover plates provided at both ends of the core column; and multiple carrier board units provided between the two cover plates and perpendicular to the system board, wherein each of the carrier board units comprises at least one via hole, at least one primary winding, at least one secondary winding and at least one switch connected with the at least one secondary winding.

16 Claims, 22 Drawing Sheets

(51) Int. Cl.
    *H01F 27/40*        (2006.01)
    *H02M 3/335*       (2006.01)
    *H05K 1/16*         (2006.01)
    *H01F 27/24*        (2006.01)
    *H02M 7/04*         (2006.01)
    *H05K 1/02*         (2006.01)
    *H05K 1/11*         (2006.01)
    *H05K 1/14*         (2006.01)
    *H05K 1/18*         (2006.01)
    *H05K 7/02*         (2006.01)
    *H05K 7/06*         (2006.01)
    *H01F 27/30*        (2006.01)
    *H02M 1/00*         (2006.01)

(52) U.S. Cl.
    CPC ............... H05K 7/026 (2013.01); H05K 7/06 (2013.01); *H01F 27/2804* (2013.01); *H01F 27/306* (2013.01); *H01F 2027/408* (2013.01); *H02M 2001/0048* (2013.01); *H05K 2201/086* (2013.01); *H05K 2201/1003* (2013.01); *H05K 2201/10015* (2013.01); *H05K 2201/10166* (2013.01); *H05K 2201/10174* (2013.01); *Y02B 70/1491* (2013.01)

CONVERTER MODULE

CROSS REFERENCE TO RELATED APPLICATION

This application is a continuation of U.S. patent application Ser. No. 15/344,765 filed on Nov. 7, 2016, which is based on and claims priority to Chinese Patent Application No. 201510780735.5, filed on Nov. 13, 2015, the entire contents of both of which are incorporated herein by reference.

TECHNICAL FIELD

The present disclosure relates to field of circuit technology, and more particularly, to a converter module.

BACKGROUND

As people require higher quality of smart life, demand for data processing has grown bigger. Energy consumption on data processing all over the world has reached, on average, hundreds or even thousands of billions of kilowatt-hours (KWHs) per year. A large data center may occupy an area of tens of thousands of square meters. Therefore, both high efficiency and high power density have become key indicators for healthy development of this industry.

Generally speaking, a server, which has a mainboard including data processing chips such as a CPU (Central Processing Unit), chipsets and memory, and power sources thereof as well as necessary peripheral components, is a key unit of the data center. With improvement of processing capacity of the server, the number and integration level of those chips are increased, requiring more space occupation and more power consumption. Accordingly, the power source (also referred to as "mainboard power source" since it is provided at a same mainboard as the data processing chips) supplying power for those chips is expected to have higher efficiency, greater power density and smaller volume, so as to save power consumption and space occupation for the server and, thus the data center. Furthermore, in order to satisfy the greater power density, switching frequency of the power source has become higher and higher.

With the development of the data center, input voltage of the power source at a POL (Point of Load) may be converted from 12V to 48V or even 400V. Output voltage of the POL, however, is generally low. Thus, a high frequency conversion circuit, which typically includes a transformer, is needed to achieve a large in-out-voltage-ratio. Nevertheless, it is difficult to enable a high efficiency in case of high frequency heavy current at the output side. In related art, for example, topology of LLC resonant converter is widely used due to its advantages such as low switching loss, high efficiency and easy extensibility of output power.

With respect to application of output with low voltage and heavy current, multiple transformers, with their high voltage sides being connected in serial and their low voltage sides being connected in parallel, as shown in FIG. 1, are usually adopted. Circuit elements in dashed boxes 61' and 62', respectively, may be defined as a circuit unit, while circuit elements in dashed box 63's are defined as high voltage side power devices. As shown in FIG. 2, each circuit unit includes a high voltage side winding 231' and a low voltage side winding 232' connected with two switching devices 233'.

FIGS. 3(a) to 3(d) illustrate block diagrams of a power module 7' with low voltage and heavy current which is well known in the art. As shown in FIG. 3(a), which is a top view, the module includes a multilayer PCB (Printed Circuit Board) carrier 71'; several high voltage side devices, for example, three transformers 72'; and pins 73' of the module. Herein, each transformer 72' includes a U-shaped magnetic core consisting of several magnetic columns 74' (e.g. two magnetic columns), each of which is coupled with a circuit unit. In other words, the power module is provided with six circuit units arranged in plane distribution. Since the multiple individual transformers 72's are provided in the module, however, air-gap control is required separately in their productions, causing bad consistency and low production efficiency.

FIG. 3(b) illustrates a cross section view along the dashed line in FIG. 3(a). As shown in FIG. 3(b), the switching devices 76' in each circuit unit are provided at upper and lower surfaces, respectively, of the PCB carrier 75', and windings of the transformer 72' are implemented via the multilayer PCB.

FIG. 3(c), which is a side view, illustrates pins 73' of the module and connection between the power module 7' and a system board 1'. Specifically, the power module 7' is connected with the system board 1' through the pins 73'.

FIG. 3(d) illustrates relative position between the magnetic columns and the system board. As shown in FIG. 3(d), the magnetic column 74' includes several sections perpendicular to the system board 1', and cover plates 77' are provided at both ends of each magnetic column 74'. Such sectional design of the magnetic 74' requires a relatively large volume of the whole power module 7'.

The power module 7' shown by FIGS. 3(a) to 3(d) is formed with a plane distribution, which may occupy a large area on the system board 1' and, also, is adverse to improvement of power density. The power module 7' is electrically connected with the system board 1' through the pins 73' which has certain impedance and, thus, may cause additional loss in case of heavy current output. Moreover, heat dissipation of the module is transferred to the system board via the pins 73'. Similarly, a thermal resistance between the module and the system board may increase due to that of the pins 73', deteriorating heat dissipation of the module.

In view of above, a converter is urgently needed to overcome those defects in conventional art.

The foregoing information is merely disclosed to facilitate understanding of background of the present disclosure. Therefore, the foregoing information may include information not constituting the prior art known to those of ordinary skill in the art.

SUMMARY

In view of those defects in related art, the present disclosure is directed to provide a converter module, so as to overcome the defects. Accordingly, several cover plates of magnetic core may be omitted, such that a total volume of the magnetic core can be substantially reduced and power density of the module can be improved. Moreover, loss of the magnetic is decreased and system efficiency is enhanced. An interface with heavy current at low voltage side can be directly connected with the system board, such that a total loss of the system can be reduced.

According to an aspect of the disclosure, there is provided a converter module, including:
    a system board;
    a circuit module; and
    an isolated rectifier unit arranged adjacent to the circuit module and connected with the system board;

wherein the isolated rectifier unit includes:

a magnetic core comprising at least one core column parallel to the system board and two cover plates provided at both ends of the core column; and multiple carrier board units provided between the two cover plates and perpendicular to the system board, wherein each of the carrier board units comprises at least one via hole, at least one primary winding, at least one secondary winding and at least one switch connected with the at least one secondary winding; wherein the at least one core column passes through the via hole of each of the carrier board units, at least one pin is provided at one side of at least one of the carrier board units close to the system board and configured to connect the carrier board units with the system board; wherein the at least one switch is located on a surface of one of the carrier board units or embedded in one of the carrier board units.

According to another aspect of the disclosure, there is also provided a converter module, including:

a system board:

a circuit module: and an isolated rectifier unit arranged adjacent to the circuit module and connected with the system board;

wherein the isolated rectifier unit comprises:

a magnetic core comprising at least one core column parallel to the system board and two cover plates provided at both ends of the core column; and multiple carrier board units provided between the two cover plates and perpendicular to the system board, wherein each of the carrier board units comprises at least one via hole, at least one primary winding, at least one secondary winding and at least one switch connected with the at least one secondary winding; wherein the at least one core column passes through the via hole of each of the carrier board units, at least one pin is provided at one side of at least one of the carrier board units close to the system board and configured to connect the carrier board units with the system board.

In view of above, according to the converter module provided by the disclosure, several cover plates of magnetic core may be omitted, such that a total volume of the magnetic core can be substantially reduced and power density of the module can be improved. Moreover, loss of the magnetic is decreased and system efficiency is enhanced.

BRIEF DESCRIPTION OF THE DRAWINGS

By referring to detailed description of the drawings and exemplary embodiments, the foregoing and other characteristics and advantages of the present disclosure will become more apparent.

Figure 1:
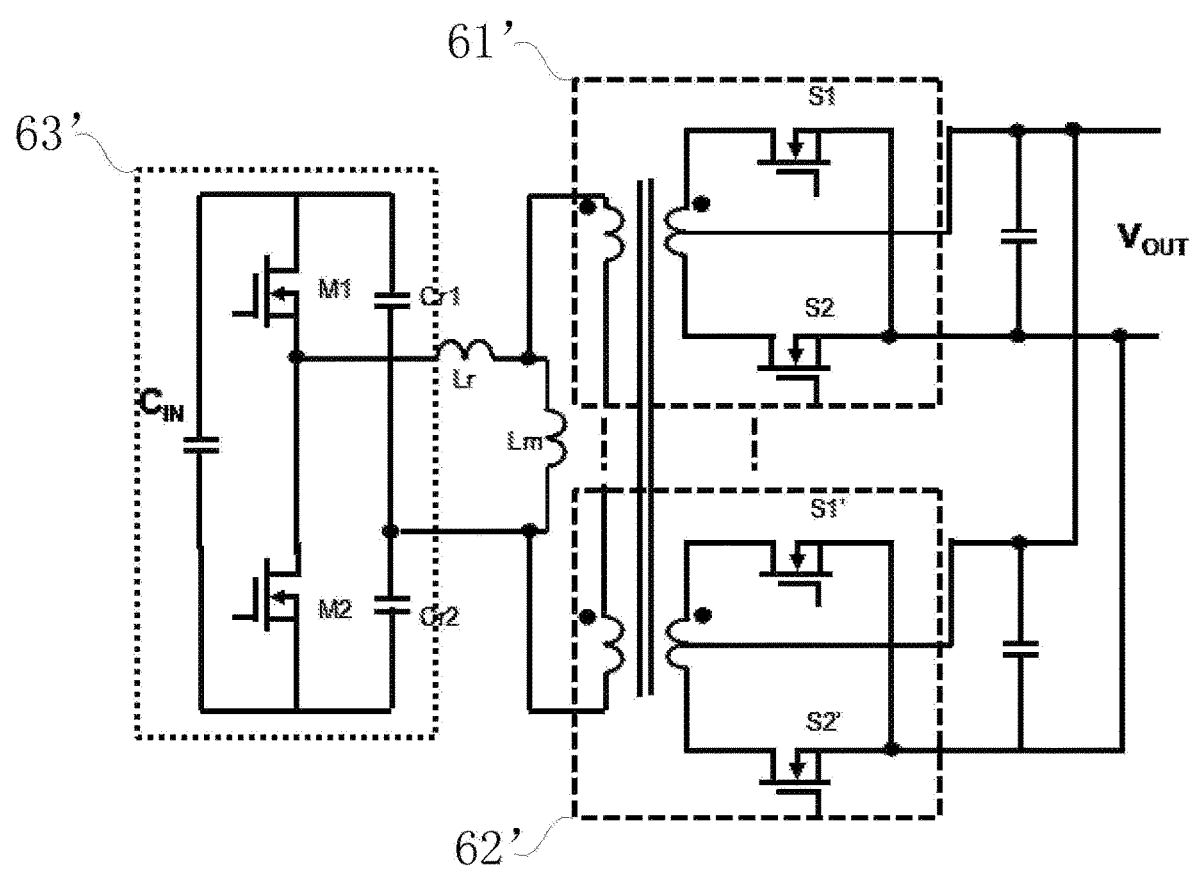
FIG. 1 illustrates a circuit diagram in prior art.

| Reference signals are listed as follows. | | | |
|---|---|---|---|
| 1' | System board | 1 | System board |
| 231' | High voltage side winding | 2 | Isolated rectifier unit |
| 232' | Low voltage side winding | 21 | Pin |
| 233' | Switching device | 22 | Magnetic core |
| 61' | Circuit unit | 221 | Core column |
| 62' | Circuit unit | 222 | Cover plate |
| 63' | High voltage side power device | 23 | Carrier board unit |
| 7' | Power module | 231 | Primary winding |
| 71' | High voltage side device | 232 | Secondary winding |
| 72' | Transformer | 233 | Switching device |
| 73' | Pin | 234 | Full-bridge rectifier circuit |
| 74' | Magnetic column | 24 | Electric conductor |
| 75' | PCB carrier | 25 | T-shaped pin |
| 76' | Power device | 26 | Pins pad |
| 77' | Cover plate | 3 | First circuit module |
| | | 4 | Second circuit module |
| | | 5 | Encapsulation material |

DETAILED DESCRIPTION

Exemplary embodiments will be described more comprehensively by referring to accompanying drawings. However, exemplary embodiments can be implemented in many forms. It shall not be understood that the present disclosure is limited to embodiments as set forth herein; instead, these embodiments are provided to ensure the present disclosure to be more comprehensive and complete. And the conception of these exemplary embodiments shall be conveyed to those skilled in the art across-the-board. In the drawings, thickness of areas and layers is exaggerated for distinctness.

The same numbers in drawings represent the same or similar structures, and thus detailed description thereof may be omitted.

Characteristics, structures or features as described may be incorporated into one or more embodiments in any suitable way. Many concrete details are provided in the following descriptions for a full understanding of embodiments of the present disclosure. However, those skilled in the art should realize that the technical solution of the present disclosure may be implemented without one or even more of specific details, and/or by using other alternative methods, components, materials and the like. In other circumstances, known structures, materials or operations are not shown or described in detail for the avoidance of fuzziness of various aspects of the present disclosure.

Figure 4:
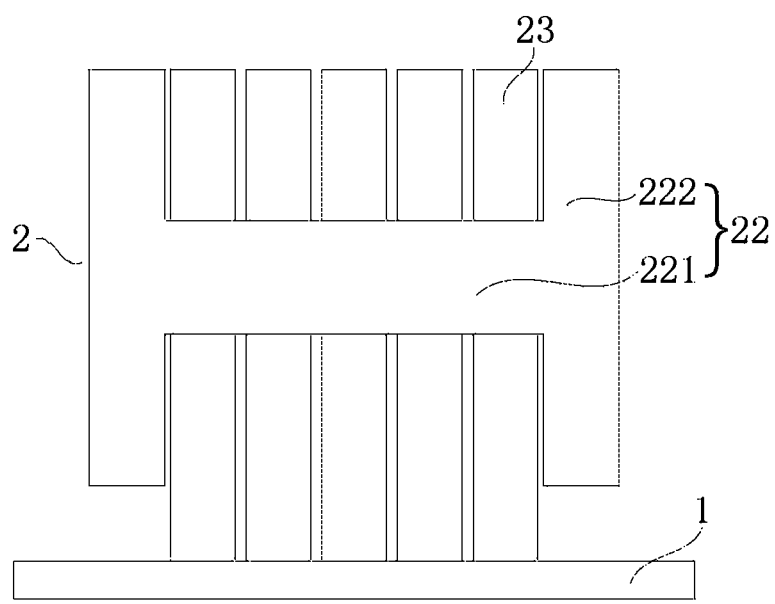
FIG. 4 is a cross section view illustrating a converter module according to a first embodiment of the disclosure.

There is provided a converter module according to an embodiment of the disclosure. As shown in FIG. 4, the converter module includes a system board 1 and an isolated rectifier unit 2. Pins of the isolated rectifier unit 2 may be directly soldered onto the system board 1 by means of SMT (Surface Mount Technology), but the disclosure is not limited thereto. In an embodiment, the isolated rectifier unit 2 includes a magnetic core 22 and multiple carrier board units 23 distributed on several carrier boards. The magnetic core 22 includes at least one core column 221 parallel to the system board 1 and two cover plates 222 provided at both ends of the core column 221. The multiple carrier board units 23 are provided between the two cover plates 222 and perpendicular to the system board 1. The carrier board unit 23 has at least one via hole, and each of the carrier board units 23 is provided thereon with at least one primary winding (not shown) and at least one secondary winding (no shown). The at least one core column 221 passes through the via hole of the carrier board unit 23, the pins (not shown) are provided at one side of at least one of the carrier board units 23 close to the system board 1 and configured to connect the carrier board units 23 with the system board 1. The pins may include signal pins and power pins configured to transmit signal and/or power. The pins of the multiple carrier board units may be provided at the same side close to the system board 1 and in contact and connection with the system board 1, but the disclosure is not limited thereto. The multiple carrier board units 23 in the embodiment are arranged in a stacked way and coupled together through the one or more core columns 221. In other words, the core column 221 is shared by the multiple carrier board units 23 to form a transformer module, but the disclosure is not limited thereto. In an alternative embodiment, the multiple carrier board units 23 may be integrated on a carrier board, and the disclosure is not limited thereto.

Figure 5:
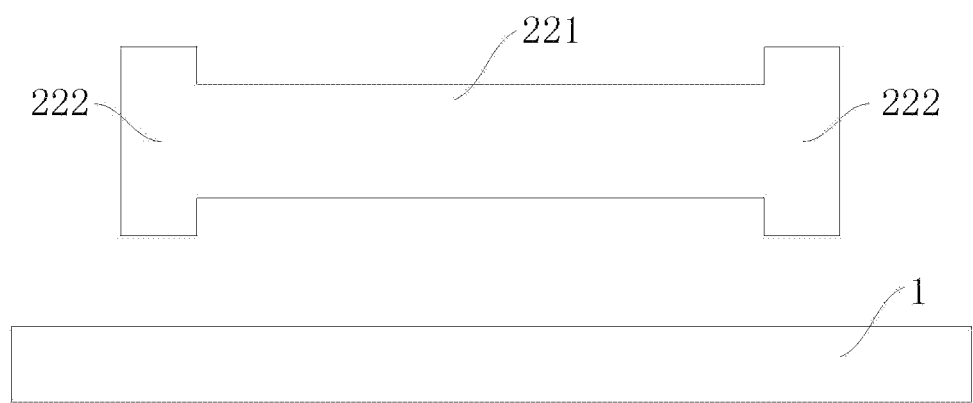
FIG. 5 is a block diagram illustrating a magnetic column in the converter module according to an embodiment of the disclosure.

As shown in FIGS. 4 and 5, the core column 221 in the embodiment is parallel to the system board 1. The multiple carrier board units 23 are integrated into a transformer module through the core column 221, such that a function similar to that of foregoing multiple transformer modules can be achieved, but the disclosure is not limited thereto. The carrier board units 23 may be adjoined to the system board, such that additional loss caused by the output pins can be reduced, and the system efficiency can be improved especially in the application of low voltage and heavy current. Moreover, as the isolated rectifier unit 2 may be also adjoined to the system board, the thermal resistance can be substantially reduced between the carrier board unit 23 and the system board 1 and, thus, a good condition of heat dissipation can be achieved for the carrier board unit 23. In addition, several cover plates of magnetic cores can be omitted, such that a total volume of the magnetic core can be reduced substantially and, accordingly, a power density of the module is improved, loss of the magnetic core is decreased and the system efficiency is enhanced, but the disclosure is not limited thereto.

As shown in FIGS. 6-9, the isolated rectifier unit 2 may be connected with the system board 1 in several different ways according to embodiments of the disclosure, but the disclosure is not limited thereto.

Figure 6:
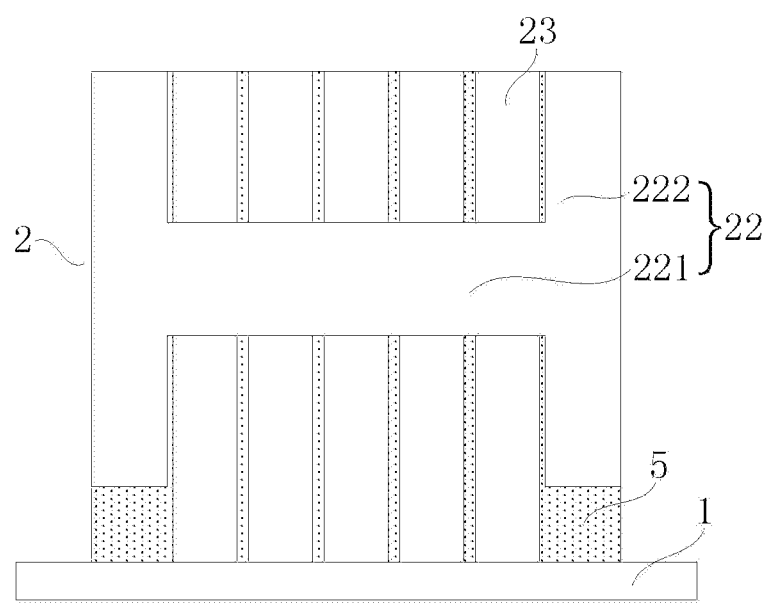
FIG. 6 is a cross section view illustrating a converter module according to a second embodiment of the disclosure.

As shown in FIG. 6, the isolated rectifier unit 2 provided according to the embodiment of the disclosure is molded by encapsulation material after being assembled. Subsequently, the encapsulated module may be grinded, such that the pins can be exposed, and, then, connected with the system board 1 via the pins.

Figure 7:
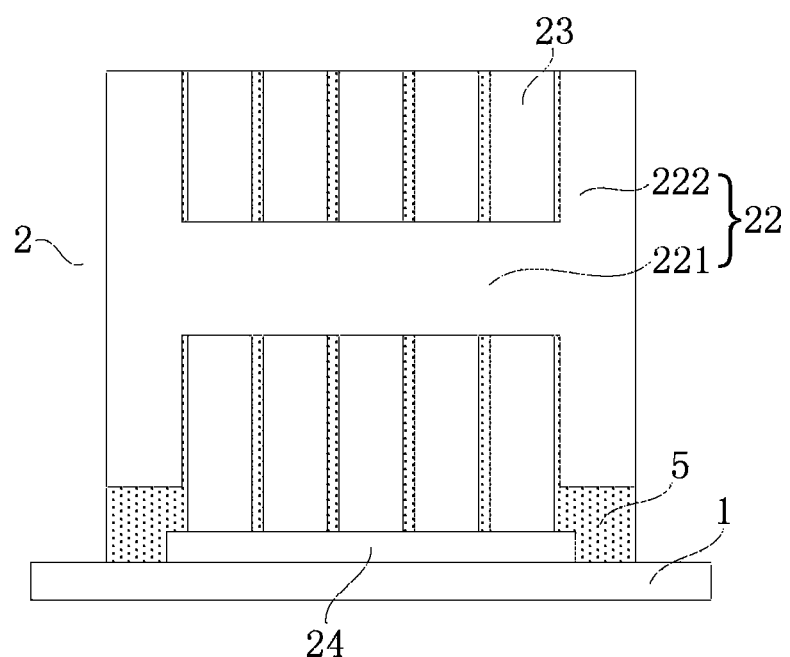
FIG. 7 is a cross section view illustrating a converter module according to a third embodiment of the disclosure.

As shown in FIG. 7, according to an embodiment of the disclosure, when the carrier board units 23 have the same output voltage and are connected in parallel at their outputs, the pins (not shown) on each carrier board unit 23 of the isolated rectifier unit 2 in the converter module may be welded to a conductive strip 24 with soldering, so as to enable electric connection, and, then, connected with the system board 1 by using the conductive strip 24 as a pin, such that a connection area can be enlarged. In an embodiment, the pins of the carrier board units 23 may be T-shaped pins, but the disclosure is not limited thereto.

Figure 8:
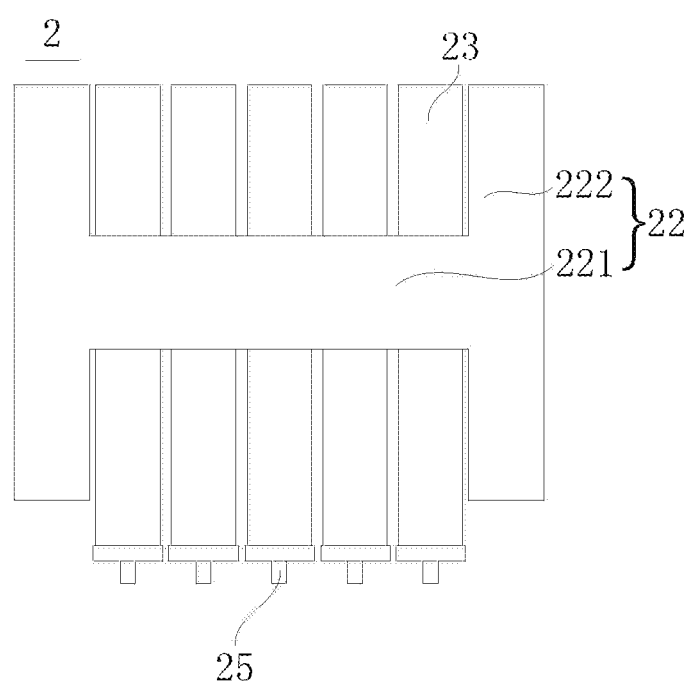
FIG. 8 is a cross section view illustrating a converter module according to a fourth embodiment of the disclosure.

As shown in FIG. 8 (the system board 1 is omitted in this drawing for clearly illustrating a structure of T-shaped pins 25), according to an embodiment of the disclosure, the pins (not shown) on each carrier board unit 23 of the isolated rectifier unit 2 in the converter module may be welded to the T-shaped pin 25 with soldering and, then, connected with the system board (not shown).

Figure 9:
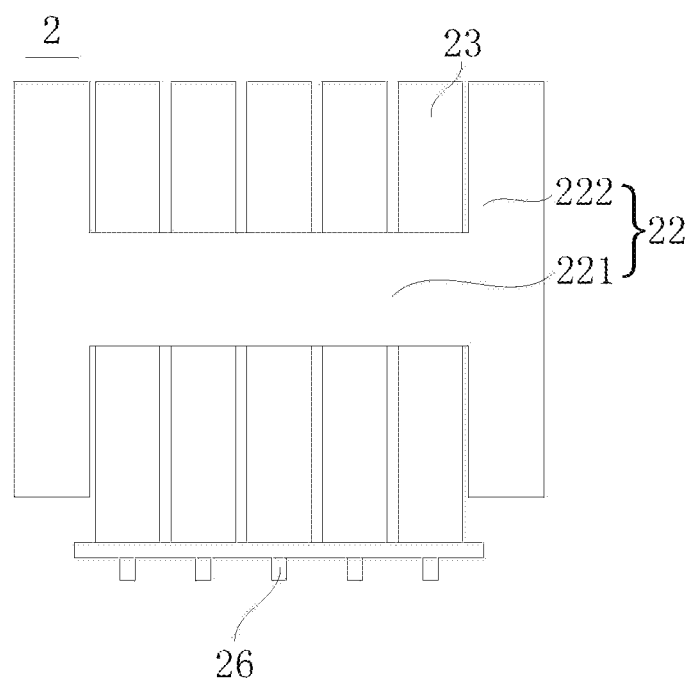
FIG. 9 is a cross section view illustrating a converter module according to a fifth embodiment of the disclosure.

As shown in FIG. 9 (the system board 1 is omitted in this drawing for clearly illustrating a structure of pins pad 26), according to an embodiment of the disclosure, when the carrier board units 23 have the same voltage and are connected in parallel at their outputs, the pins (not shown) on each carrier board unit 23 of the isolated rectifier unit 2 in the converter module may be welded with soldering to the pins pad 26, which is formed by soldering several T-shaped pins with each other, and, then, connected with the system board (not shown).

Moreover, connection reliability between the carrier board units 23 and the T-shaped pins or the conductive strip may be strengthened by using adhesive in manufacturing process. For example, after assembly of the transformer is completed, the adhesive may be introduced into gaps between PCBs, such that the conductive strip can be fixed to the PCB before being welded, but the disclosure is not limited thereto.

Figure 10:
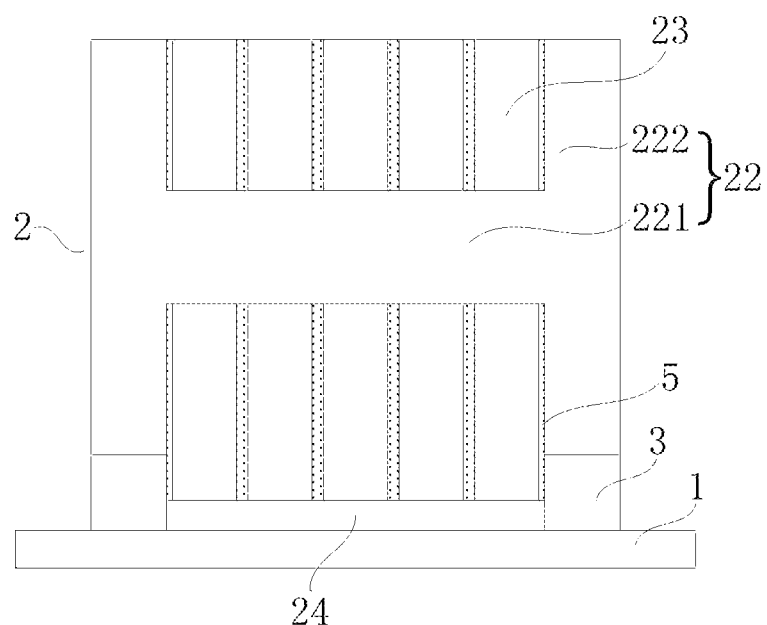
FIG. 10 is a cross section view illustrating a converter module according to a sixth embodiment of the disclosure.
Figure 11:
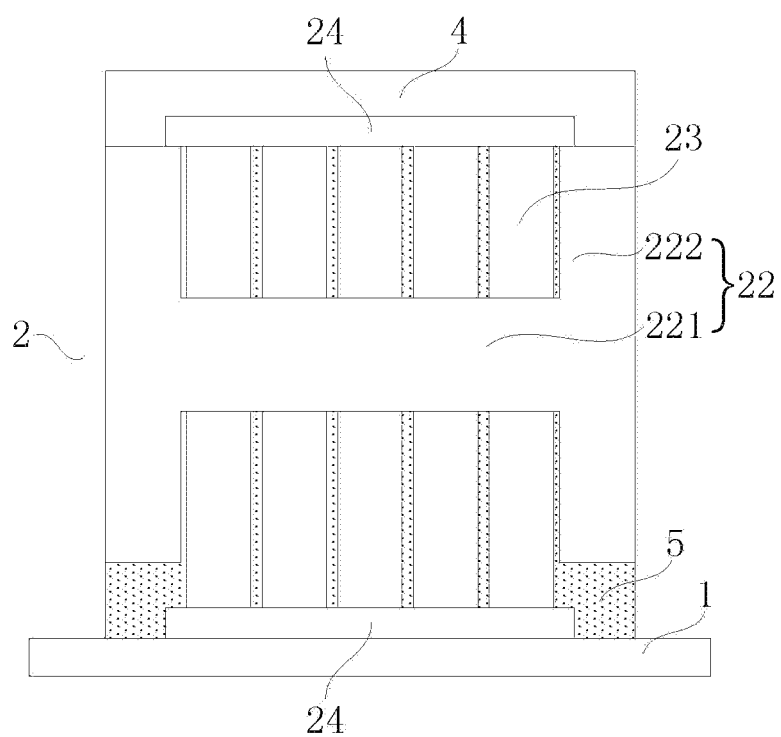
FIG. 11 is a cross section view illustrating a converter module according to a seventh embodiment of the disclosure.

As shown in FIGS. 10-11, other function modules may be introduced in addition to the isolated rectifier unit 2 and the system board 1 according embodiments of the disclosure, but the disclosure is not limited thereto.

Referring to FIG. 10, the transformer module according to an embodiment of the disclosure further includes a first circuit module 3 located between the cover plate 222 and the system board 1 and close to the system board 1. The first circuit module 3 is coupled with the system board 1 and may include at least one or all of an IPM (Intelligent Power Module), a high voltage side power device module and a control module, but the disclosure is not limited thereto.

Referring to FIG. 11, the transformer module according to an embodiment of the disclosure further includes a second circuit module 4 located at upper side of the carrier board unit 23. The carrier board unit may be connected with the second circuit module 4 via the conductive strip 24, but the disclosure is not limited thereto. For example, they can be connected with each other directly or in other manners. The second circuit module 4 may include at least one of a resonant inductor module, a magnetizing inductor and a high voltage side power device module, but is not limited thereto. The magnetizing inductor may be integrated into the transformer module by adjusting air-gaps of the magnetic core in the transformer module.

In another embodiment of the disclosure, the transformer module may) be also provided with both the forgoing first and second circuit module 3 and 4, and description thereof is not elaborated herein.

Figure 12:
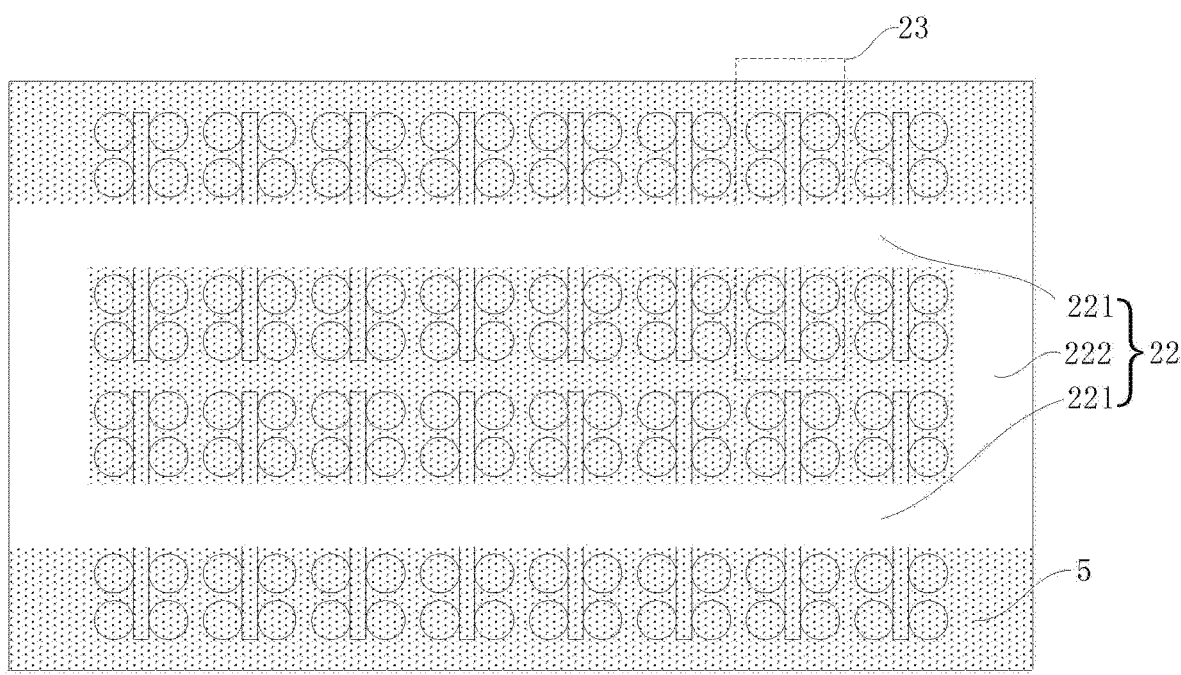
FIG. 12 is a cross section top view illustrating a converter module according to an eighth embodiment of the disclosure.
Figure 13:
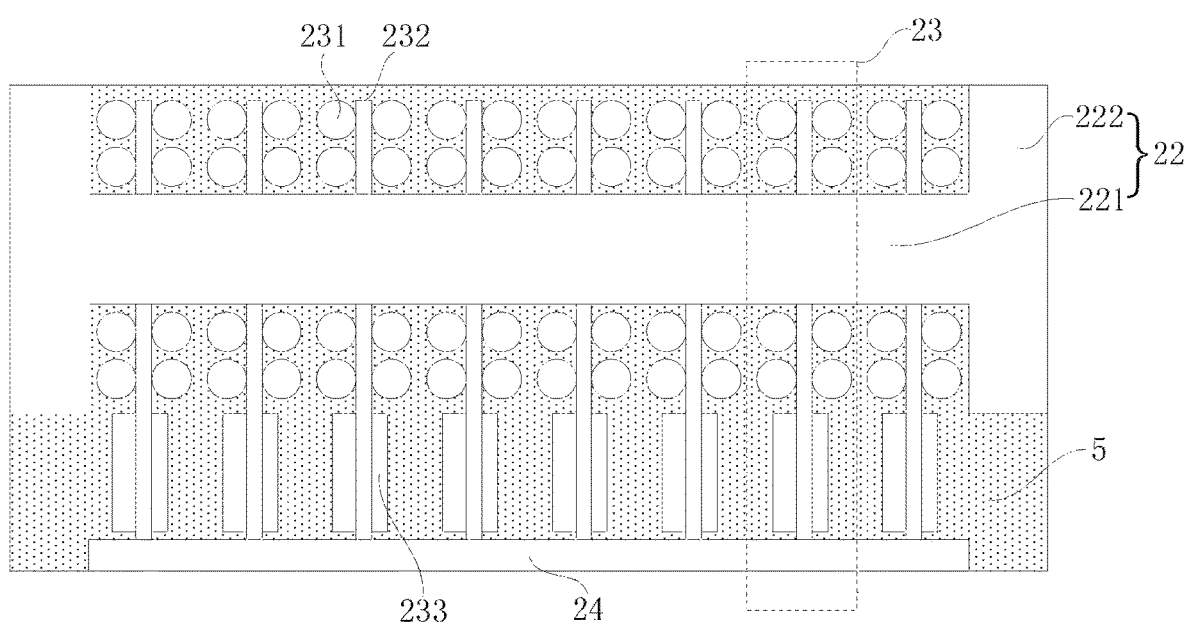
FIG. 13 is a cross section front view illustrating the converter module according to the eighth embodiment of the disclosure.
Figure 14:
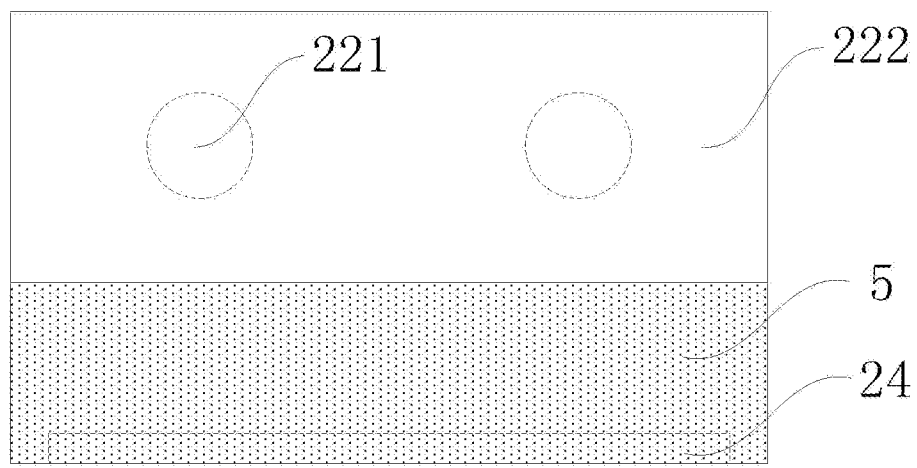
FIG. 14 illustrates a side view of FIG. 13.

As shown in FIGS. 12-14, the magnetic core 22 in the transformer module according to an embodiment of the disclosure includes two core columns 221 parallel to the system board 1 and two cover plates 222 provided at both ends of the core columns 221. The carrier board unit 23 includes at least one via hole through which each of the core columns 221 passes. The carrier board unit 23 may be perpendicular to the system board 1, but is not limited thereto. Each of the carrier board unit 23 may be provided thereon some primary windings 231, some secondary windings 232 and some switching devices 233. The primary winding 23 may be a winding coil surrounding the core column 221 and formed by conductive wire, but is not limited thereto. In an alternative embodiment, any of the primary winding 231 and the secondary winding 232 may also be a winding coil surrounding the core column 221 and formed in PCB layout of the carrier board units. The switching device 233 may be connected with the secondary winding 232 of the carrier board unit 23 and may be located on a surface thereof or embedded into the carrier board unit 23. The switching device 233 may be a MOSFET or a diode, but is not limited thereto. The primary winding 231 and the secondary winding 232 may be arranged in a structure of P-S-P or S-P-S or P-S-S-P or S-P-P-S (P is indicative of the primary winding 231, while S is indicative of the secondary winding 232), but is not limited thereto.

Figure 15:
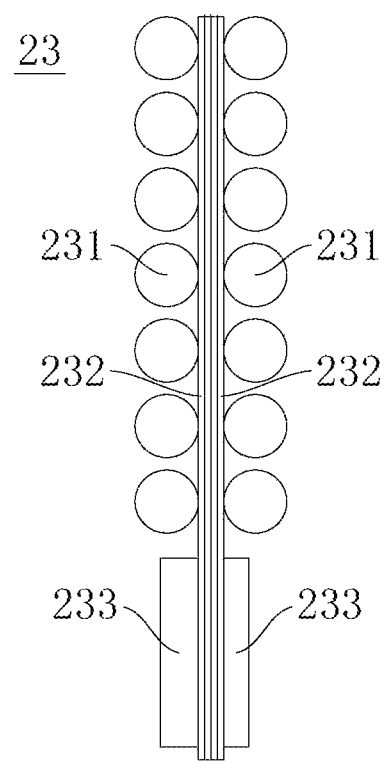
FIG. 15 is a block diagram illustrating a first carrier board unit in the converter module according to the eighth embodiment of the disclosure.
Figure 16:
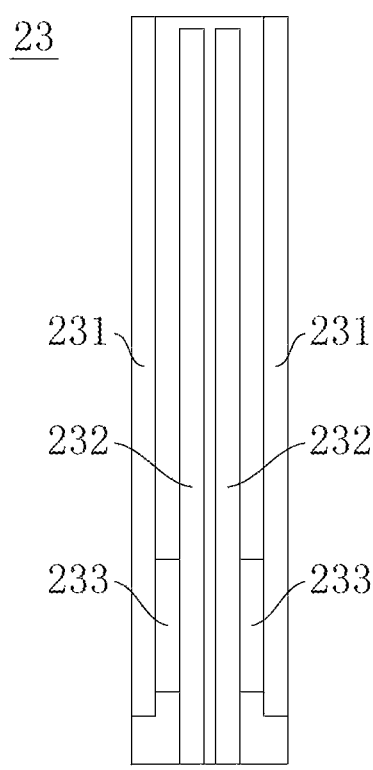
FIG. 16 is a block diagram illustrating a second carrier board unit in the converter module according to the eighth embodiment of the disclosure.

For description of two main structures of the carrier board unit 23, FIGS. 15-16 illustrate an example in which there are the primary winding 231, the secondary winding 232 with taps (the windings are arranged in the structure of P-S-S-P, where P is indicative of the primary winding 231 and S is indicative of the secondary winding 232) and two switching devices 233, but the disclosure is not limited thereto.

As shown in FIG. 15, the secondary windings 232 of the carrier board unit 23 are formed of winding coils on the PCB, and the winding coils may be provided surrounding the core column 221 and formed on each layer of the multilayer PCB, but the disclosure is not limited thereto. The primary windings 231 may be winding coils surrounding the core column 221 and formed by conductive wire, and may be provided in symmetry on both sides at the top of the multilayer PCB far away from the system board 1, but the disclosure is not limited thereto. The two switching devices 233 may be provided in symmetry on both sides at the bottom of the multilayer PCB close to the system board 1, but the disclosure is not limited thereto. For example, the two switching devices 233 may be provided at different positions in different layers, respectively.

As shown in FIG. 16, the carrier board unit 23 in whole may be formed in a multilayer PCB. The secondary windings 232 may be winding coils surrounding the core column 221 and formed in PCB layout of the carrier board units. The primary windings 231 may be provided respectively at both sides of the secondary windings 232, and may also be winding coils surrounding the core column 221 and formed in PCB layout of the carrier board units. The switching devices 233 may be embedded into the PCB, but is not limited thereto.

The multiple carrier board units 23 may be provided by integrating a plurality of the multilayer PCBs as shown in FIG. 16 into an assembled PCB. In such case, the assembled PCB may include more layers, and there may be no gaps between adjacent carrier board units 23 parallel to each other, but the disclosure is not limited thereto.

There is also provided a transformer module according to an embodiment of the disclosure. The transformer module may be mounted on the system board 1 and includes a magnetic core 22 and multiple carrier board units. In an embodiment, the magnetic core 22 includes at least one core column 221 parallel to the system board 1 and two cover plates provided at both ends of the core column. The multiple carrier board units are provided between the two cover plates, and at least some of the multiple carrier board units are parallel with each other. Moreover, the carrier board unit 23 includes at least one via hole and is provided thereon with at least one primary winding 231 and at least one secondary winding 232. The at least one core column 221 passes through the via hole on the carrier board unit 23. Furthermore, each of the carrier board units 23 includes at least one switching device 233 connected with the secondary winding 232 of the carrier board unit. There is at least one pin 21 formed at one side of at least one of the carrier board units 23. Related technical solution has been described as above and, thus, is not elaborated herein.

Figure 2:
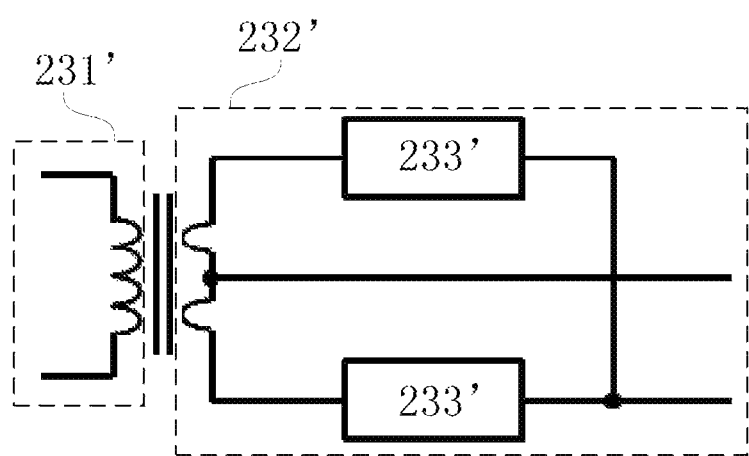
FIG. 2 is a circuit diagram illustrating the transformer unit in FIG. 1.
Figure 3:
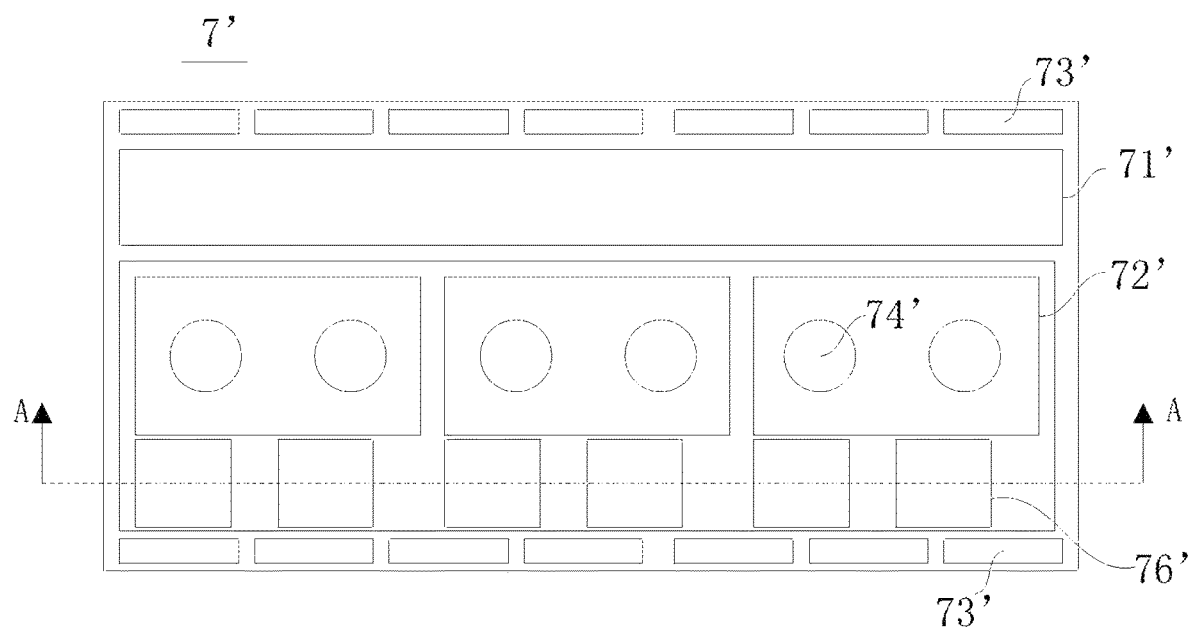
FIG. 3(a) is a cross section top view illustrating a power module in prior art.
FIG. 3(b) illustrates a cross section view along A-A direction in FIG. 3(a).
FIG. 3(c) illustrates a side view of FIG. 3(a).
FIG. 3(d) illustrates a relative position of the magnetic column and the system board in FIG. 3(c).
Figure 3:
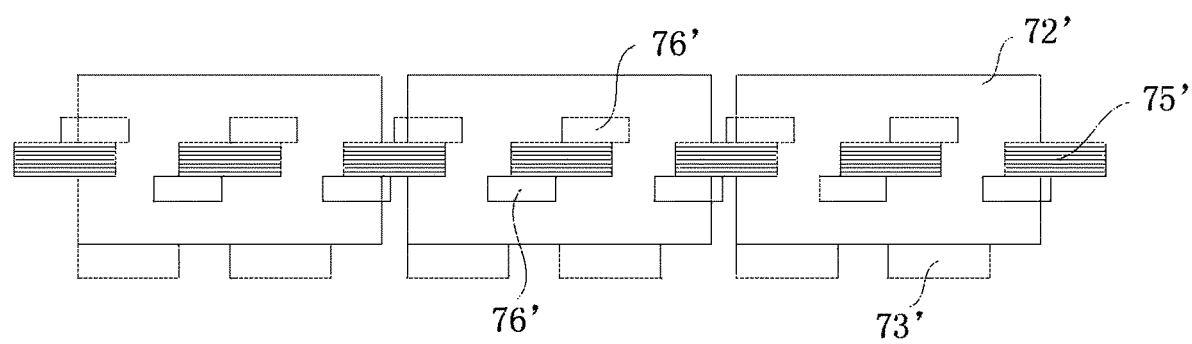
Figure 3:
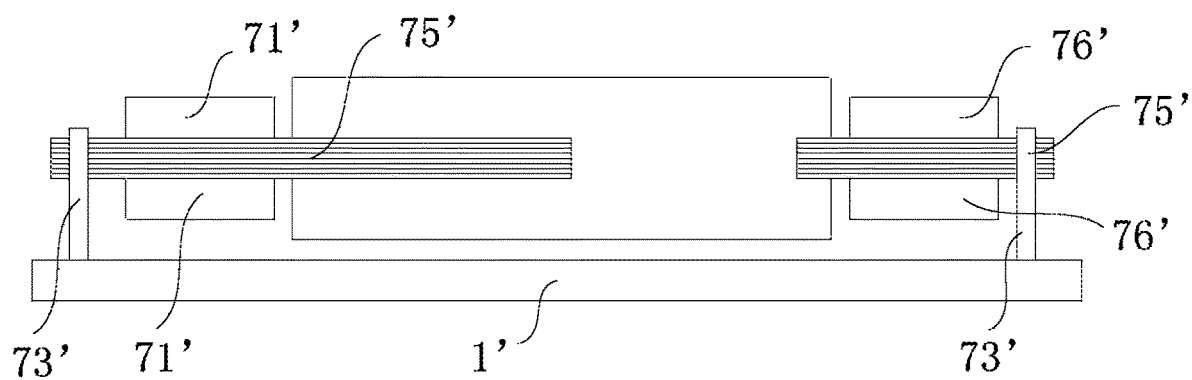
Figure 3:
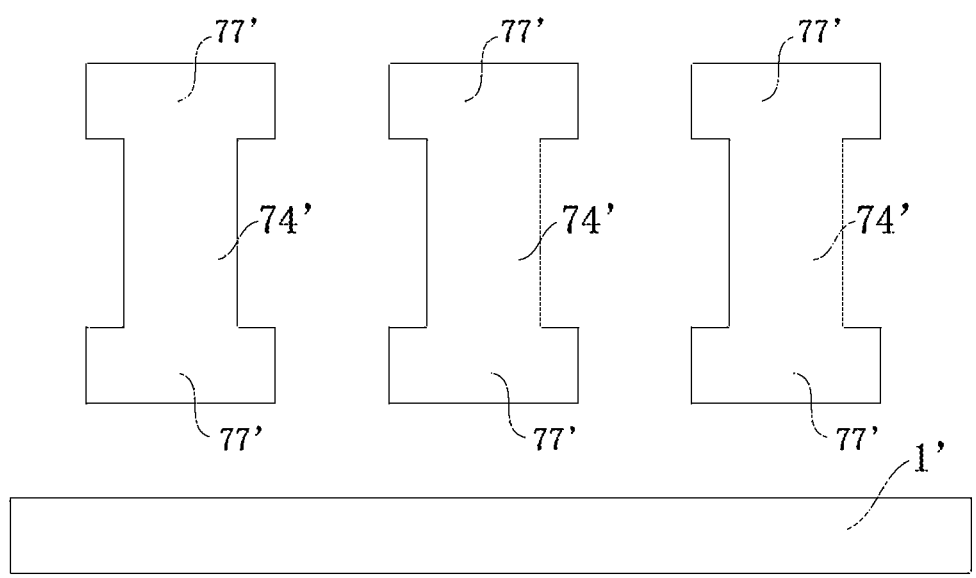
Figure 17:
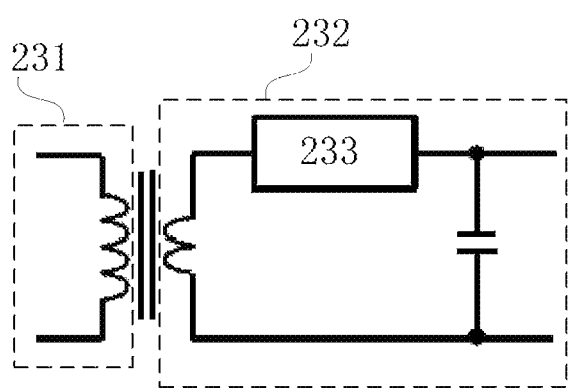
FIG. 17 is a circuit diagram illustrating a flyback converter unit according to an embodiment of the disclosure.

There is also provided a circuit according to an embodiment of the disclosure, which includes the transformer module as described above. The circuit may be implemented as a resonant circuit or a flyback circuit. Related technical solution has been described as above and, thus, is not elaborated herein. According to an embodiment of the disclosure, the circuit unit included in the carrier board unit 23 may be also implemented as, instead of the transformer unit (referring to FIG. 2) with central taps, a circuit unit in the flyback converter shown by FIG. 17. In other words, there is only one switching device 233 in the secondary winding 232, but is not limited thereto. As shown in FIG. 17, one or more output capacitor may be connected with the secondary winding 232. The output capacitor may be placed in the carrier board unit 23, as the switching device 233 shown in FIG. 15 and FIG. 16, placed on the surface of the PCB or embedded in the PCB, but the disclosure is not limited thereto.

Figure 18:
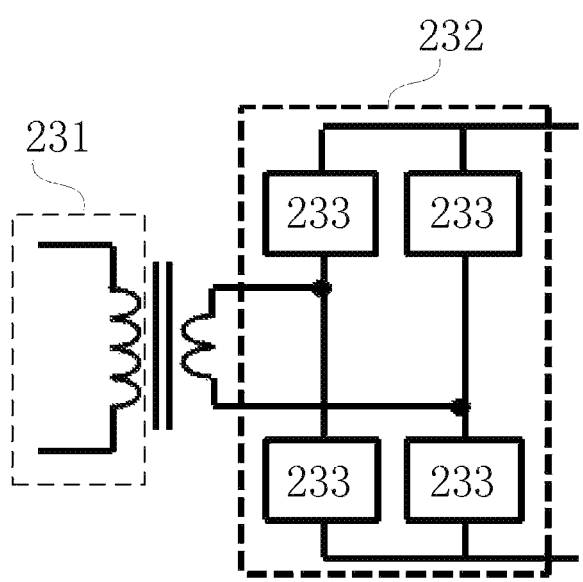
FIG. 18 is a circuit diagram illustrating a full-bridge converter unit according to an embodiment of the disclosure.

As shown in FIG. 18, the carrier board unit 23 may be applied as a transformer unit in a full-bridge converter, that is, there are four separate switching devices 233 included in the secondary winding 232, but the disclosure is not limited thereto.

Figure 19:
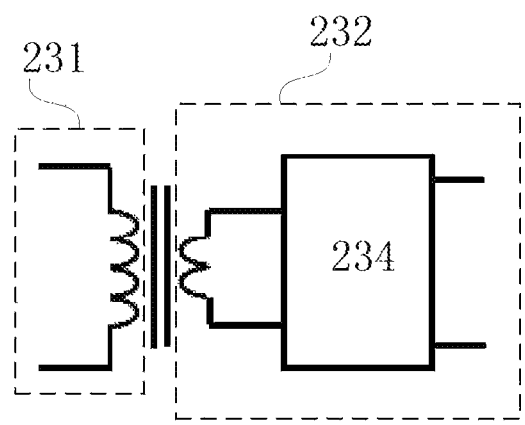
FIG. 19 is a circuit diagram illustrating a full-bridge rectifier module according to an embodiment of the disclosure.

As shown in FIG. 19, the four switching devices 233 may be integrated into a full-bridge rectifier module 234 through a packaging process. Alternatively, four switches may be centrally provided on a silicon chip through an integration process at wafer level, to form a full-bridge rectifier IC (Integrated Circuit), but the disclosure is not limited thereto.

As can be seen from above, according to the converter module, transformer module and the circuit provided in embodiments of the disclosure, several cover plates of magnetic core may be omitted, such that a total volume of the magnetic core can be substantially reduced and power density of the module can be improved. Moreover, loss of the magnetic may be decreased and system efficiency may be enhanced.

What is mentioned above concretely illustrated and describes exemplary embodiments of the present disclosure. Nevertheless, it should be understood that the present disclosure is not limited to the embodiments disclosed herein. On the contrary, the present disclosure is intended to cover various modifications and equivalent arrangements within the spirit and scope of the appended claims.

What is claimed is:

1. A converter module, comprising:
a system board;
a circuit module; and
an isolated rectifier unit arranged adjacent to the circuit module and connected with the system board;
wherein the isolated rectifier unit comprises:
a magnetic core comprising at least one core column parallel to the system board and two cover plates provided at both ends of the core column; and
multiple carrier board units provided between the two cover plates and perpendicular to the system board, wherein each of the carrier board units comprises at least one via hole, at least one primary winding, at least one secondary winding and at least one switch connected with the at least one secondary winding; wherein the at least one core column passes through the via hole of each of the carrier board units, at least one pin is provided at one side of at least one of the carrier board units close to the system board and configured to connect the carrier board units with the system board; wherein the at least one switch is located on a surface of one of the carrier board units or embedded in one of the carrier board units.

2. The converter module as claimed in claim 1, wherein the circuit module comprises at least a power device electrically connected to the primary winding.

3. The converter module as claimed in claim 2, wherein the circuit module further comprises a control module.

4. The converter module as claimed in claim 1, wherein the circuit module further comprises at least one of a resonant inductor, a resonant capacitor, a magnetizing inductor and a power device.

5. The converter module as claimed in claim 1, wherein the circuit module is located between the cover plates and the system board and close to the system board.

6. The converter module as claimed in claim 1, wherein the circuit module is located at an upper side of one of the carrier board units.

7. The converter module as claimed in claim 6, wherein the converter module further comprises another circuit module located between the cover plates and the system board and close to the system board.

8. The converter module as claimed in claim 6, wherein the circuit module connects with one of the carrier board units via a connective strip.

9. The converter module as claimed in claim 5, wherein the converter module is a resonant circuit or a flyback circuit.

10. The converter module as claimed in claim 1, wherein at least two of the carrier board units have a same output voltage and are connected in parallel at outputs.

11. The converter module as claimed in claim 1, wherein the at least one pin is T-shaped.

12. The converter module as claimed in claim 1, wherein the at least one pin forms an electric conductor and is connected to at least two of the carrier board units, the electric conductor being in contact and coupled with the system board.

13. The converter module as claimed in claim 1, wherein the electric conductor is a conductive strip, or a pad formed by soldering a plurality of T-shaped pins.

14. The converter module as claimed in claim 1, wherein the carrier board units further comprises at least one output capacitor which is located on a surface of one of the carrier board units or embedded in one of the carrier board units.

15. The converter module as claimed in claim 6, wherein the converter module is a resonant circuit or a flyback circuit.

16. A converter module, comprising:
a system board;
a circuit module; and
an isolated rectifier unit arranged adjacent to the circuit module and connected with the system board;
wherein the isolated rectifier unit comprises:
a magnetic core comprising at least one core column parallel to the system board and two cover plates provided at both ends of the core column; and
multiple carrier board units provided between the two cover plates and perpendicular to the system board, wherein each of the carrier board units comprises at least one via hole, at least one primary winding, at least one secondary winding and at least one switch connected with the at least one secondary winding; wherein the at least one core column passes through the via hole of each of the carrier board units, at least one pin is provided at one side of at least one of the carrier board units close to the system board and configured to connect the carrier board units with the system board.

* * * * *